United States Patent
Xie et al.

(10) Patent No.: US 9,553,148 B2
(45) Date of Patent: Jan. 24, 2017

(54) METHOD OF MAKING A WIRE-BASED SEMICONDUCTOR DEVICE

(71) Applicant: ASM IP Holding B.V., Almere (NL)

(72) Inventors: Qi Xie, Leuven (BE); Vladimir Machkaoutsan, Leuven (BE); Jan Willem Maes, Wilrijk (BE)

(73) Assignee: ASM IP HOLDING B.V. (NL)

( * ) Notice: Subject to any disclaimer, the term of this patent is extended or adjusted under 35 U.S.C. 154(b) by 0 days.

(21) Appl. No.: 14/678,301

(22) Filed: Apr. 3, 2015

(65) Prior Publication Data

US 2015/0214301 A1  Jul. 30, 2015

Related U.S. Application Data

(63) Continuation of application No. 14/045,680, filed on Oct. 3, 2013, now Pat. No. 9,012,278.

(51) Int. Cl.
*H01L 51/05* (2006.01)
*H01L 29/10* (2006.01)
(Continued)

(52) U.S. Cl.
CPC .......... *H01L 29/1037* (2013.01); *B82Y 10/00* (2013.01); *H01L 21/0254* (2013.01);
(Continued)

(58) Field of Classification Search
None
See application file for complete search history.

(56) References Cited

U.S. PATENT DOCUMENTS

| 4,450,472 A | 5/1984 | Tuckerman et al. |
| 4,938,742 A | 7/1990 | Smits |

(Continued)

FOREIGN PATENT DOCUMENTS

| WO | WO 98/03996 | 1/1998 |
| WO | WO 98/03997 | 1/1998 |

(Continued)

OTHER PUBLICATIONS

Bangsaruntip et al., "High performance and highly uniform gate-all-around silicon nanowire MOSFETs with wire size dependent scaling", *IEEE*, 12.3.1-4.
(Continued)

*Primary Examiner* — Benjamin Sandvik
(74) *Attorney, Agent, or Firm* — Knobbe, Martens, Olson & Bear LLP

(57) ABSTRACT

In some embodiments, a method for manufacturing forms a semiconductor device, such as a transistor. A dielectric stack is formed on a semiconductor substrate. The stack comprises a plurality of dielectric layers separated by one of a plurality of spacer layers. Each of the plurality of spacer layers is formed of a different material than immediately neighboring layers of the plurality of dielectric layers. A vertically-extending hole is formed through the plurality of dielectric layers and the plurality of spacer layers. The hole is filled by performing an epitaxial deposition, with the material filling the hole forming a wire. The wire is doped and three of the dielectric layers are sequentially removed and replaced with conductive material, thereby forming upper and lower contacts to the wire and a gate between the upper and lower contacts. The wire may function as a channel region for a transistor.

13 Claims, 12 Drawing Sheets

(51) Int. Cl.

| | | |
|---|---|---|
| H01L 21/8238 | (2006.01) | |
| H01L 21/02 | (2006.01) | |
| B82Y 10/00 | (2011.01) | |
| H01L 29/66 | (2006.01) | |
| H01L 29/775 | (2006.01) | |
| H01L 29/06 | (2006.01) | |
| H01L 21/768 | (2006.01) | |
| H01L 21/288 | (2006.01) | |
| H01L 29/423 | (2006.01) | |
| H01L 29/78 | (2006.01) | |
| B82Y 40/00 | (2011.01) | |

(52) U.S. Cl.
CPC ...... *H01L 21/288* (2013.01); *H01L 21/76816* (2013.01); *H01L 21/76877* (2013.01); *H01L 21/76897* (2013.01); *H01L 21/823814* (2013.01); *H01L 21/823885* (2013.01); *H01L 29/068* (2013.01); *H01L 29/0676* (2013.01); *H01L 29/42392* (2013.01); *H01L 29/6656* (2013.01); *H01L 29/66439* (2013.01); *H01L 29/66666* (2013.01); *H01L 29/775* (2013.01); *H01L 29/7827* (2013.01); *B82Y 40/00* (2013.01); *H01L 51/057* (2013.01); *Y10S 977/89* (2013.01); *Y10S 977/938* (2013.01)

(56) References Cited

U.S. PATENT DOCUMENTS

| | | |
|---|---|---|
| 5,218,515 A | 6/1993 | Bernhardt |
| 5,241,450 A | 8/1993 | Bernhardt et al. |
| 5,461,003 A | 10/1995 | Havemann et al. |
| 5,619,177 A | 4/1997 | Johnson et al. |
| 5,777,292 A | 7/1998 | Grigorov et al. |
| 5,901,037 A | 5/1999 | Hamilton et al. |
| 5,936,295 A | 8/1999 | Havemann et al. |
| 6,060,383 A | 5/2000 | Nogami et al. |
| 6,197,641 B1 | 3/2001 | Hergenrother et al. |
| 6,239,025 B1 | 5/2001 | Bease et al. |
| 6,272,169 B1 | 8/2001 | Boswell, Jr. et al. |
| 6,291,353 B1 | 9/2001 | Muller et al. |
| 6,365,529 B1 | 4/2002 | Hussein et al. |
| 6,406,995 B1 | 6/2002 | Hussein et al. |
| 6,482,733 B2 | 11/2002 | Raaijmakers et al. |
| 6,534,395 B2 | 3/2003 | Werkhoven et al. |
| 6,569,754 B2 | 5/2003 | Wong et al. |
| 6,629,425 B2 | 10/2003 | Vaiyapuri et al. |
| 6,686,271 B2 | 2/2004 | Raaijmakers et al. |
| 6,699,783 B2 | 3/2004 | Raaijmakers et al. |
| 6,703,708 B2 | 3/2004 | Werkhoven et al. |
| 6,716,693 B1 | 4/2004 | Chan et al. |
| 6,727,169 B1 | 4/2004 | Raaijmakers et al. |
| 7,018,917 B2 | 3/2006 | Elers |
| 7,374,990 B2 | 5/2008 | Tang et al. |
| 8,138,046 B2 | 3/2012 | Pribat et al. |
| 9,012,278 B2 * | 4/2015 | Xie ................. H01L 21/823814 438/199 |
| 2003/0032281 A1 | 2/2003 | Werkhoven et al. |
| 2003/0143839 A1 | 7/2003 | Raaijmakers et al. |
| 2005/0048709 A1 | 3/2005 | Layman et al. |
| 2011/0012085 A1 | 1/2011 | Deligianni et al. |

FOREIGN PATENT DOCUMENTS

| | | |
|---|---|---|
| WO | WO 98/04109 | 1/1998 |
| WO | WO 03/053895 | 7/2003 |

OTHER PUBLICATIONS

Blackburn et al., "Deposition of conformal copper and nickel films from supercritical carbon dioxide," *Science* 294(5540) (2001) pp. 141-145.

Cabanas et al., "Alcohol-Assisted Deposition of Copper Films from Supercritical Carbon Dioxide," *J. Chemistry of Materials* 15(15) (2003) pp. 2910-2916.

Dagani, "Dry Spinning of Carbon Nanotube Yarns"; 1 page.

Hergenrother et al., "50 nm vertical replacement-gate (VRG) nMOSFETs with ALD $HfO_2$ and $Al_2O_3$ gate dielectrics", *IEEE*, 2001; 4 pages.

Jiang et al., "Spinning continuous carbon nantube yarns", *Nature*, vol. 419, Oct. 24, 2002, p. 801.

Kondoh et al., "Characteristics of copper deposition in a supercritical CO2 fluid," *Microelectronic Engineering* 64(1-4) (2002) pp. 495-499.

Lesiak et al., "Characterization of polyacetylene and polyacetylene doped with palladium", *Polish J. Chem.*, vol. 74, 2000, pp. 847-865.

Lu et al., *Advanced Metallization Conference* 2000 (ULSI XVI), pp. 515-521.

Shirakawa et al., "Synthesis of Electrically Conducting Organic Polymers: Halogen Derivatives of Polyacetylene, (Ch).sub.x," *J.C. S., Chem. Comm.*, 578-580 (1977).

Soundarapandian et al., "Vertical nanowire gate-all-around p-type tunneling field-effect transistor with $Si_{0.8}Ge_{0.2}$/Si heterojunction", *International Conference on Solid-State and Integrated Circuit*, vol. 32; 2012; 5 pages.

Tay, "Analytical Study on a MEMS Micro-Cooling System for Cooling of Flip Chips," *Conf. on Design, Characterization, and Packaging for MEMS and Microelectronics*, Queensland, Australia, Oct. 99, SPIE vol. 3893, pp. 82-93.

Thelander et al., "Nanowire-based one-dimensional electronics", *Materials Today*, vol. 9, No. 10, Oct. 2006; pp. 28-35.

* cited by examiner

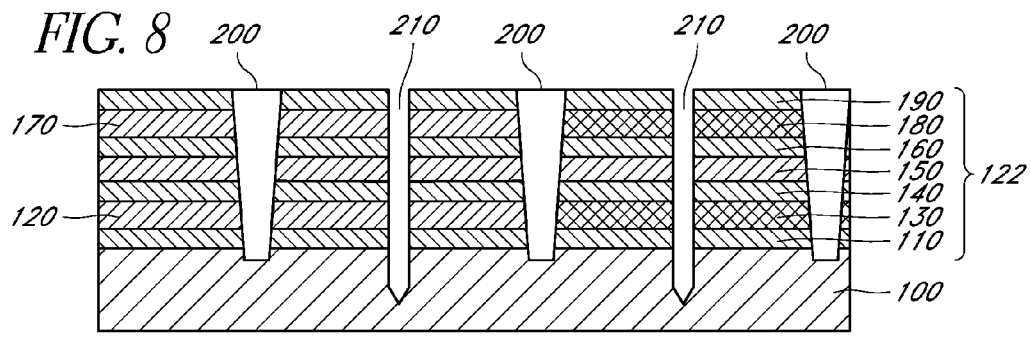
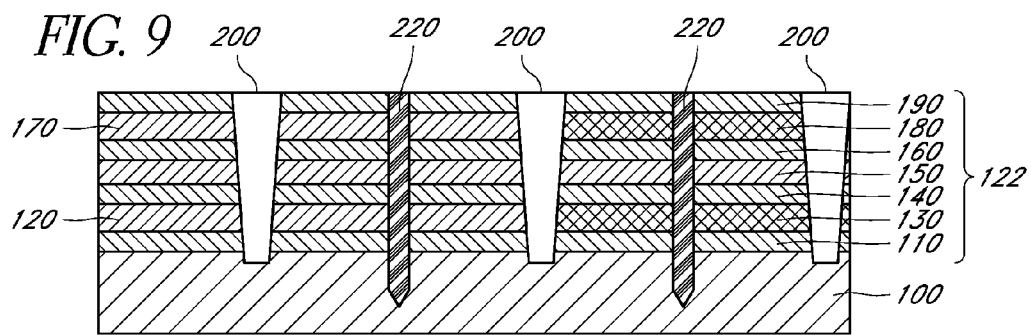
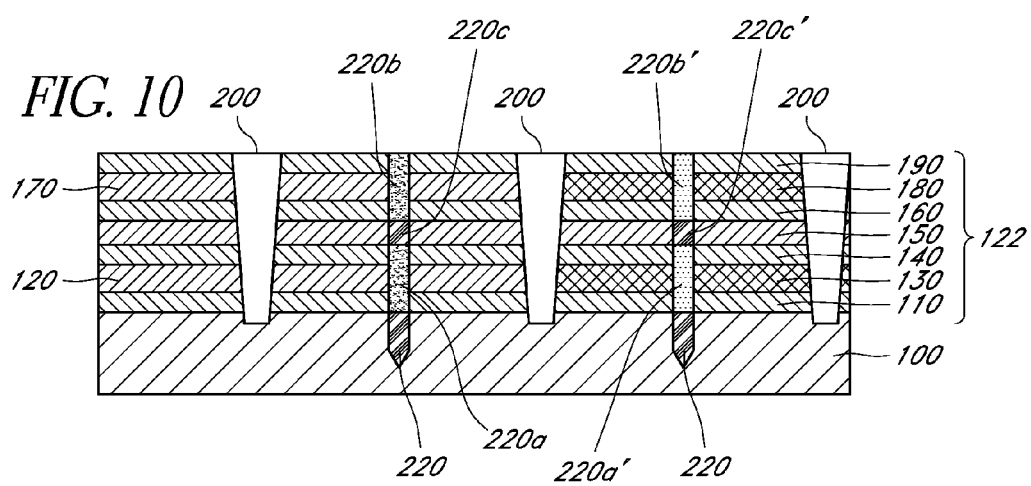

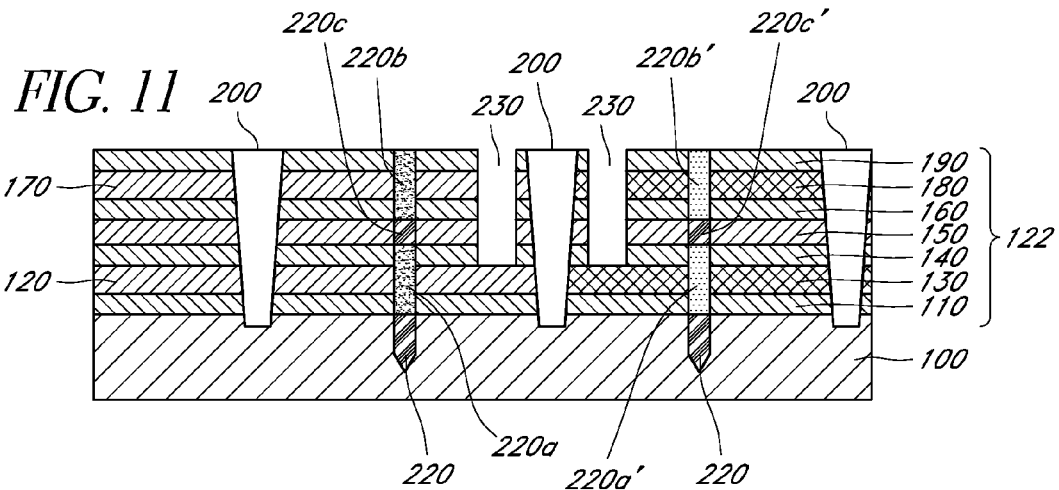
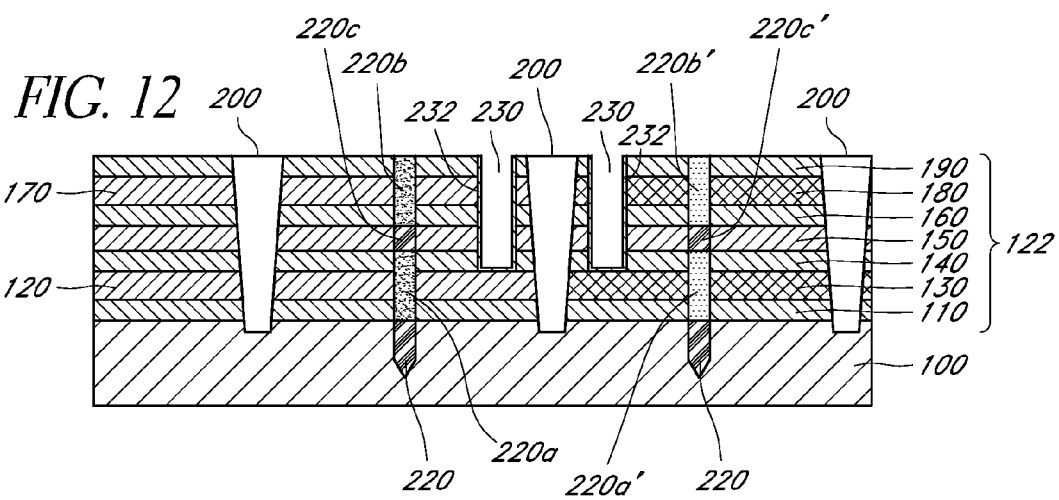
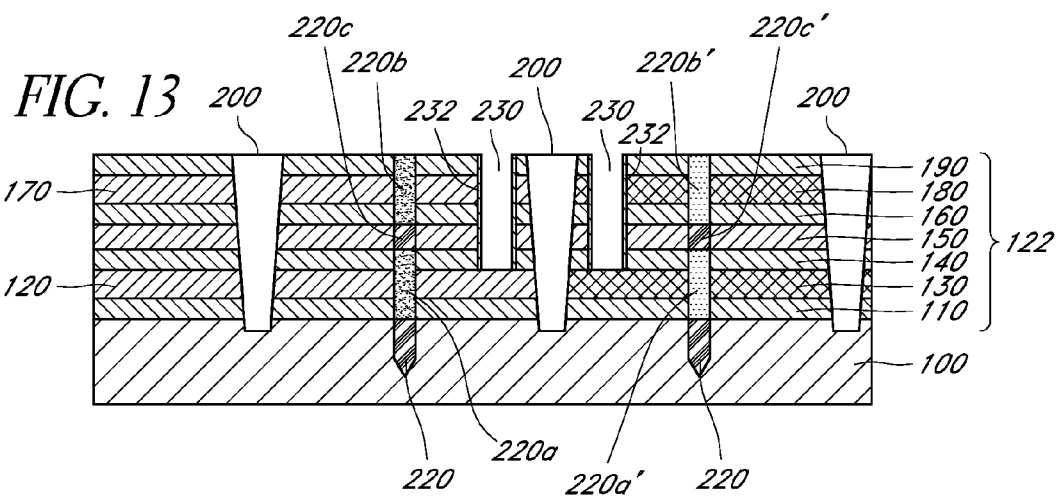

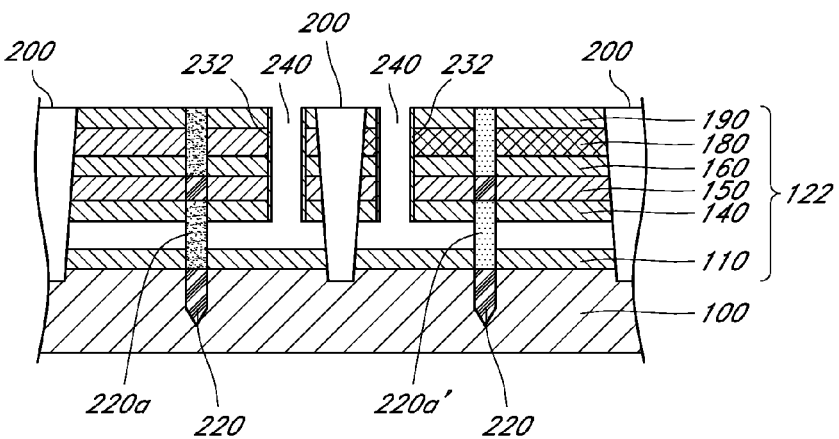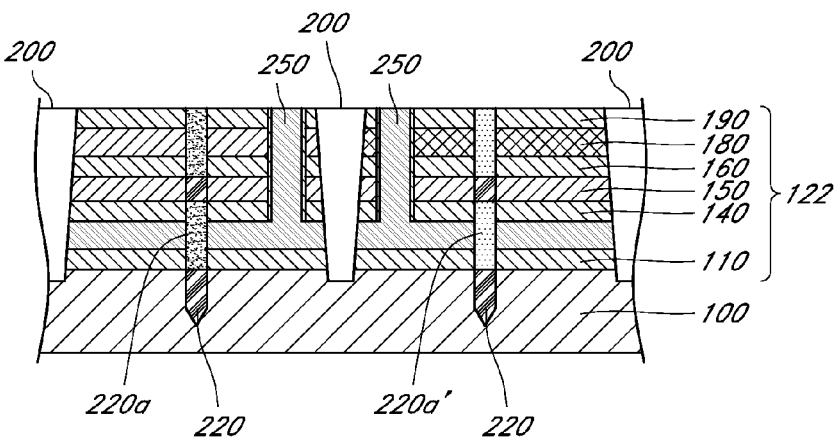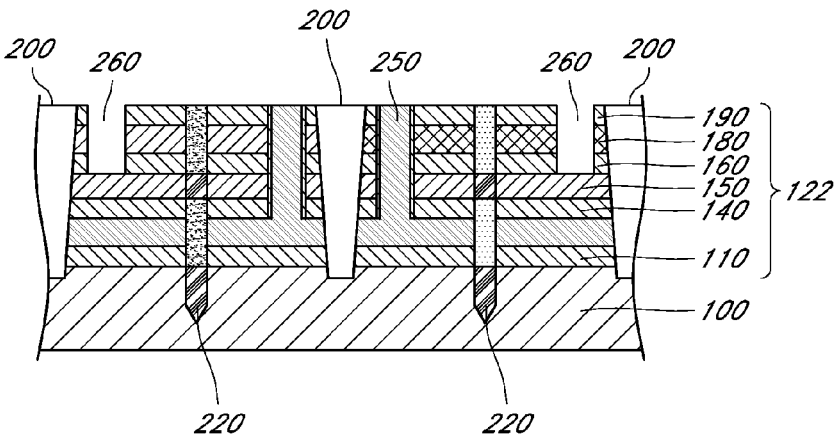

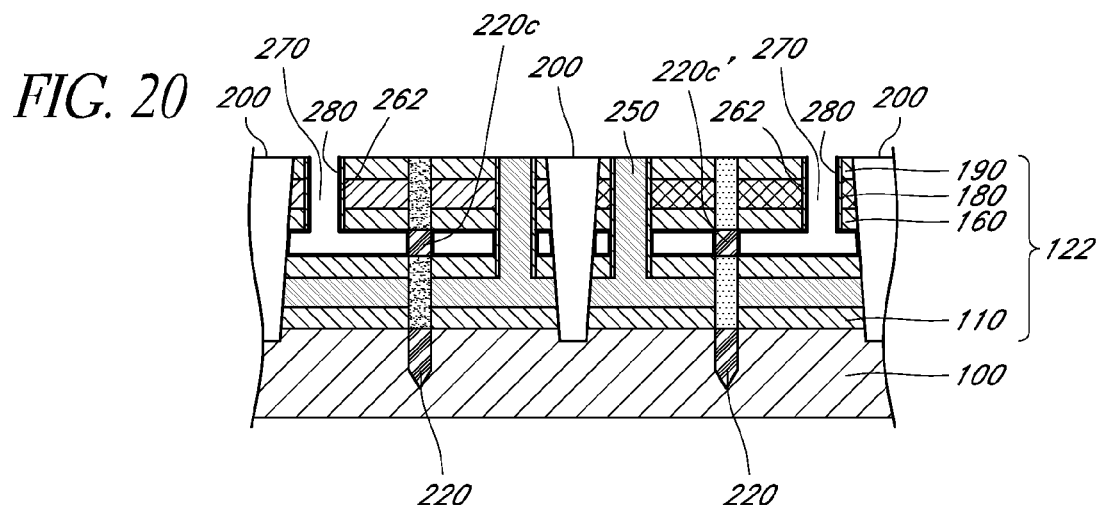
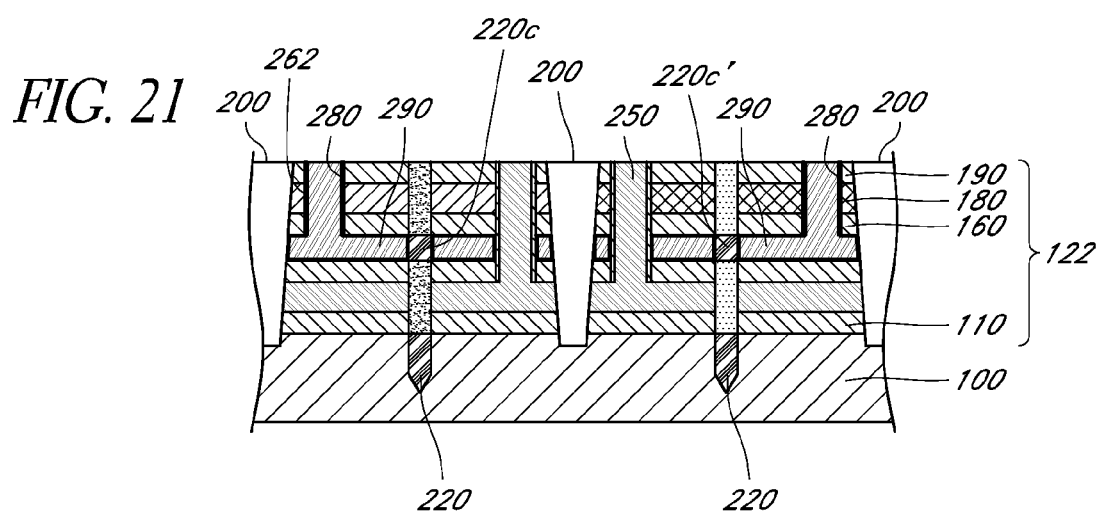

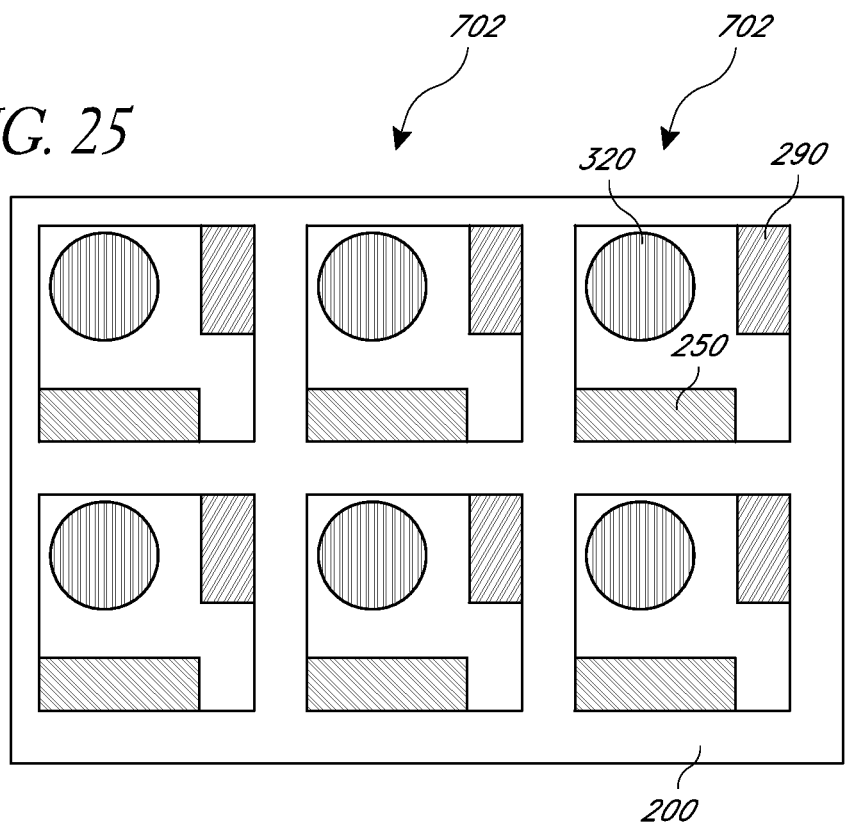

METHOD OF MAKING A WIRE-BASED SEMICONDUCTOR DEVICE

REFERENCE TO RELATED APPLICATIONS

This application is a continuation of U.S. patent application Ser. No. 14/045,680, filed Oct. 3, 2013, entitled METHOD OF MAKING A WIRE-BASED SEMICONDUCTOR DEVICE, the entire disclosure of which is incorporated herein by reference.

FIELD

The invention relates to semiconductor processing and, more particularly, to the formation of semiconductor devices, such as transistors.

DESCRIPTION OF THE RELATED ART

Due to continuing demand for increased computing power from integrated circuits, the density of the semiconductor devices forming the integrated circuits is continually being increased. To facilitate these ever higher device densities, the sizes of the semiconductor devices are continually being reduced.

Transistors are one example of such devices. As transistors become smaller, however, various problems can arise. For example, reductions in transistor size can cause reductions in the sizes of constituent features. As a result, the voltages that the transistor is exposed to may be reduced to achieve reliable operation of the device. Threshold voltages of the transistor may similarly be reduced. The magnitude of the voltage swings available for operating the transistor is also reduced, which can make it difficult to completely turn the transistor "off." Thus, the continued miniaturization of transistors can contribute to undesirable increases in leakage current.

Consequently, there is a continuing need for semiconductor device structures and methods of manufacture that facilitate continued decreases in device sizes.

SUMMARY

In an example of one aspect, a method for manufacturing a semiconductor device is provided. The method comprises providing a mono-crystalline silicon substrate. A stack of layers comprising three oxide layers separated by spacer layers is formed over the substrate. A vertical nanowire hole is etched in the stack down to the mono-crystalline substrate. A nanowire is formed by filling the nanowire hole using an epitaxial deposition process.

In an example of another aspect, a method for manufacturing a semiconductor device is provided. The method comprises providing a silicon substrate. A dielectric stack is formed on the substrate, the dielectric stack comprising a plurality of dielectric layers. Neighboring dielectric layers are separated by a spacer layer formed of a different material than the neighboring dielectric layers. A vertically-extending hole is formed through the dielectric stack. The hole is filled by performing an epitaxial deposition, wherein material filling the hole forms a wire.

BRIEF DESCRIPTION OF THE DRAWINGS

Various features, aspects, and advantages are described herein with reference to the drawings, which are intended to illustrate certain embodiments and not to limit the disclosure. The drawings are not necessarily to scale. In addition, like numerals refer to like parts throughout.

FIG. 8 is a schematic cross-sectional view of the structure of FIGS. 7A and 7B after etching openings in the dielectric stack.

FIG. 9 is a schematic cross-sectional view of the structure of FIG. 8 after filling the openings in the dielectric stack to form vertically-extending wires.

FIG. 10 is a schematic cross-sectional view of the structure of FIG. 9 after doping material filling the openings in the dielectric stack.

FIG. 11 is a schematic cross-sectional view of the structure of FIG. 10 after forming openings for defining lower contacts.

FIG. 12 is a schematic cross-sectional view of the structure of FIG. 11 after lining the openings for defining the lower contacts.

FIG. 13 is a schematic cross-sectional view of the structure of FIG. 12 after removing the liners at the bottoms of the openings.

FIG. 14 is a schematic cross-sectional view of the structure of FIG. 13 after removing portions of exposed dielectric layers.

FIG. 15 is a schematic cross-sectional view of the structure of FIG. 14 after filling buried open volumes with conductive material to form lower contacts.

FIG. 16 is a schematic cross-sectional view of the structure of FIG. 15 after forming openings for defining gates.

FIG. 20 is a schematic cross-sectional view of the structure of FIG. 19 after forming dielectric liners in the buried open volumes.

FIG. 21 is a schematic cross-sectional view of the structure of FIG. 20 after filling buried open volumes with conductive material to form gates.

FIG. 25 is a schematic cross-sectional top-down view of the structure of FIG. 24.

DETAILED DESCRIPTION

As transistors scale below critical dimensions of 25 nm and beyond (e.g., to 15 nm or less, or 10 nm or less) current flow through the increasingly shorter channel lengths become more difficult to control and the higher densities leave decreasing amounts of space for making electrical contacts with the transistors. As a result, the electrical behavior of the transistors may suffer and reliably manufacturing and forming contacts to the transistors may be difficult.

Figure 1:
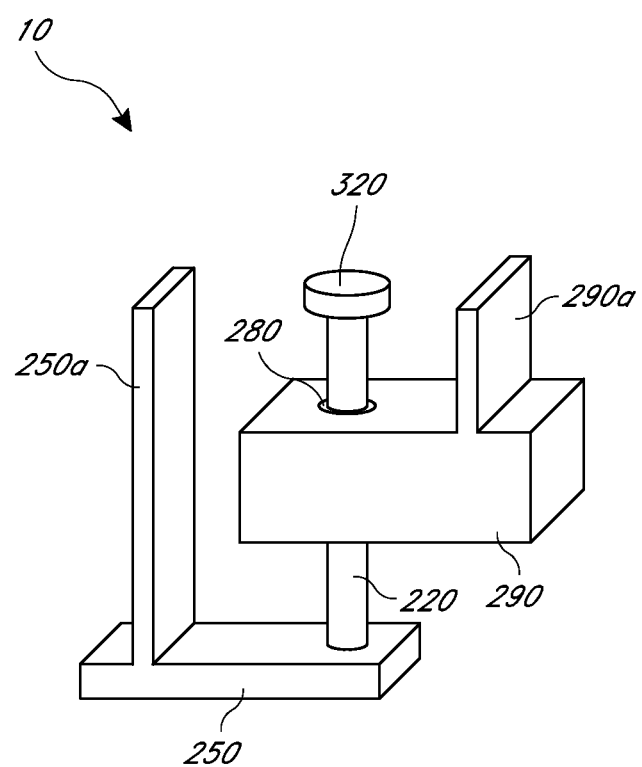
FIG. 1 is an example of a schematic perspective view of a vertical wire-based transistor.

Vertical wire-based transistors with gates wrapping around or extending on multiple sides of the wire may provide a superior transistor architecture. FIG. 1 is an example of a schematic perspective view of a vertical wire-based transistor 10. A wire 220 of doped semiconductor material forms a channel region, around which a gate 290 is formed by a conductive material. The wire 220 and gate 290 are separated by a gate dielectric 280. As illustrated, the gate 290 can have an upwardly extending portion 290a for forming a gate contact. As illustrated, the gate preferably extends completely around the perimeter of the wire 220. A lower contact 250 provides electrical contact to a lower end of the wire 220. The lower contact 250 can have an upwardly extending portion 250a for forming an electrical contact to that lower contact. An upper contact 320 provides electrical contact to an upper end of the wire 320. It will be appreciated that the lower contact 250 and the upper contact 320 may function as source/drain contacts. As used herein, it will also be appreciated that the term wire indicates an elongated conductive or semiconductive structure having a length greater than its width. The cross-sectional shape, as seen in a cross-section taken in a plane extending transverse to the length of wire, may be any arbitrary shape. In some embodiments, the cross-sectional shape is circular.

With continued reference to FIG. 1, the vertically-extending wire can provide a longer channel than available in conventional devices that have laterally extending gates, while also providing a small footprint, which may be as small as or smaller than those conventional devices. In combination with the gate wrapping around or extending along multiple sides of the wire, these vertical devices can provide improved control over current flow. In addition, the vertically-extending wire can leave more area adjacent to it for forming contacts, thereby facilitating reliable connections to other devices in an integrated circuit that includes these transistors.

In some embodiments described herein, methods are provided for forming a generally vertically-extending, wire-based device. A stack of dielectric layers separated by spacer layers are formed over a substrate. In some embodiments, two or more, or three or more dielectric layers are provided, with the spacer layers separating the dielectric layers. Dielectric layers may be disposed above and below each spacer layer. A vertically-extending opening is formed in the dielectric layer and the opening is filled to form the vertically-extending wire. In some embodiments, the fill is accomplished by an epitaxial deposition. Upper and/or lower contacts to the wire are formed by replacing portions of the dielectric layers, adjacent upper and/or lower portions of the wire, with conductive material. The conductive material may occupy openings that extend to an upper surface of the dielectric stack to thereby form electrical contacts on that surface. Where three or more dielectric layers are provided, a dielectric layer adjacent to a middle portion of the wire may also be replaced with conductive material, which also extends to the top surface of the dielectric layer to form an electrical contact. This middle contact structure may be separated from the wire by a dielectric and may function as a transistor gate.

In some embodiments, the wire may be doped by driving dopant from neighboring doped dielectric regions into the wire during drive-in anneal. In some other embodiments, the wire may be doped as-deposited.

The devices formed by the wire may be laterally isolated from other devices using a laterally isolation trench filled with dielectric material to form a lateral etch stop and isolation wall. The lateral etch stop defines individual, isolated cells in which the devices may be accommodated. In some embodiments, the lateral etch stop may include multiple layers of material. For example, a liner may form the outer wall of the lateral etch stop and may be resistant to etches used for the etching of the dielectric layers described herein. An interior of the lateral etch stop may be formed of another dielectric.

The transistors in neighboring cells may form complementary metal-oxide-semiconductor (CMOS) structures, including P-MOS and N-MOS structures. In some embodiments, the wires in each of the P-MOS and N-MOS structures may be formed of different semiconductor materials.

It will be appreciated that the various layers and materials discussed herein, including the various contacts and the transistor gate, may be deposited by atomic layer deposition (ALD). For the various ALD depositions described herein, the substrate surface to be deposited upon may be alternatingly exposed to mutually reactive precursors, with a deposition cycle including absorption of a first precursor on the deposition surface and then reaction of the absorbed precursor by a second mutually reactive precursor to form a layer (e.g., a "monolayer") of a reaction product. The cycles are repeated and the monolayers are deposited over one another until the deposited material reaches a total desired thickness. In some embodiments, the alternating exposure is accomplished by flowing precursors in temporally separated pulses into a deposition chamber that accommodates the substrate. In some other embodiments, the alternating exposure may be accomplished by movement of the substrate and/or reactor parts, without pulsing precursors into the deposition chamber at different times by stopping and starting the flow of precursors into the chamber. It will be appreciated that each deposition cycle can include other reactive species in addition to the first and second precursors. In some other embodiments, the precursors used in the deposition cycles may change over time.

As discussed herein, in some embodiments, the wire-based device is a semiconductor device, such as a transistor. The upper and lower contacts can function as source/drain contacts and the middle conductive material can be separated from the wire by a dielectric and function as a gate. In some other embodiments, one or more of the dielectric layers may be omitted, or replacement of those one or more dielectric layers can be omitted. In such cases, the methods may be applied to form other devices having vertically-extending conductive or semi-conductive wires with contacts at upper and/or lower portions of the wires.

Advantageously, as noted above, devices formed by the methods can occupy exceptionally small areas, while allowing a large fraction of the area occupied by the devices to be used for forming contacts. This can improve the ease with which contacts to the devices are formed and the ultimate reliability of the devices. For example, in some embodiments, the transistors may occupy cells having critical dimensions of about 25 nm or less, about 15 nm or less, or about 10 nm or less. Moreover, in embodiments in which transistors are formed, the gate may be formed on multiple sides of, or completely surrounding the perimeter of, the wire. Such an arrangement can improve control over current flow through the wire. In addition, as discussed herein, each contact and the gate can be formed on different levels, separated by dielectric. The dielectric may advantageously protect other previously-formed structures, including the gate, from exposure to etchants and possibly undesirable alterations and damage caused by such exposure.

Figure 2A:
FIG. 2A is a schematic cross-sectional view of a substrate.

With reference now to FIG. 2A, a schematic cross-sectional view of a substrate 100 is shown. The substrate 100 may be a semiconductor substrate comprising semiconductor materials, including, for example, bulk semiconductor materials such as a semiconductor wafer (either alone or in an assembly with other materials, including materials formed on or below the semiconductor wafer) and semiconductor material layers (such as in an assembly with other materials). In some embodiments, the substrate includes a silicon wafer. It will be appreciated that the substrate may include various features, such as isolation structures, doped regions, and/or electronic devices on the same or other levels.

Figure 2B:
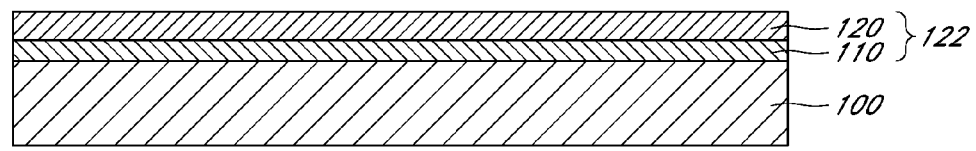
FIG. 2B is a schematic cross-sectional view of the structure of FIG. 2A after forming etch stop and dielectric layers to form part of a dielectric stack.

In a first phase of some embodiments, a dielectric stack may be formed on the substrate 100. FIG. 2B is a schematic cross-sectional view of the structure of FIG. 2A after forming an etch stop layer 110 and a dielectric layer 120 to form part of a dielectric stack 122. In the context of this document, the term "layer" encompasses both the singular and the plural unless otherwise indicated. A layer may overlie a portion of, or the entirety of, an underlying substrate.

With continued reference to FIG. 2B, the etch stop layer 110 may be formed of a material that is resistant to an etch that may later be used to remove the dielectric layer 120. For example, the etch stop layer 110 may be formed of silicon nitride and the dielectric layer 120 may be formed of silicon oxide. Each of the layers 110 and 120 may be deposited by a deposition process using gas phase precursors, for example, a chemical vapor deposition (CVD) process or atomic layer deposition (ALD) process. Such processes, particularly ALD processes, can have advantages for forming uniform and conformal layers at the thicknesses desired for small electronic devices, such as those with critical dimensions of about 25 nm or less.

In some implementations, the dielectric layer 120 may be doped, for example, with phosphorus, arsenic, antimony, boron, gallium or indium. In some embodiments, the dopant is a p-type dopant such boron. It will be appreciated that the dopant may be incorporated into the dielectric layer 120 by, for example, ion implantation of dopant species, or by diffusion of gaseous dopant species.

In some other embodiments, the dopants may be incorporated into the dielectric layer 120 as-deposited, as that layer is formed. For example, the dielectric layer 120 may be doped during an atomic layer deposition in which the substrate is alternately and sequentially exposed to two or more precursors at different times. The alternating precursors may include the precursors for the compound forming the layer 120 and also include a dopant precursor. A deposition cycle includes substantially separately exposing the substrate to each precursor at least once. Multiple deposition cycles are sequentially performed to build up the deposited layer until a desired aggregate thickness is reached. The substrate may also be exposed to a plasma, such as an oxygen, nitrogen, argon, helium, hydrogen or fluorine plasma during the deposition cycles. In some embodiments, a variable dopant profile can be formed within the layer 120 by exposing the substrate to dopant in only some deposition cycles. For example, deposition cycles forming the lower and upper sublayers of the layer 120 may exclude the dopant precursor, thereby allowing those layers to be formed dopant-free. These dopant-free sublayers may aid in encapsulating the dopant in the layer 120 and reduce undesired dopant diffusion into underlying and overlying layers.

Figure 3:
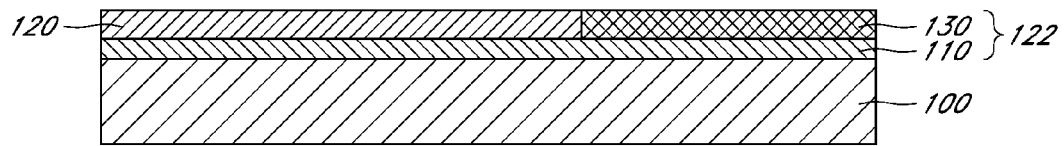
FIG. 3 is a schematic cross-sectional view of the structure of FIG. 2B after replacing part of the dielectric layer with a differently doped dielectric.

Part of the dielectric layer 120 may be replaced by an oppositely doped dielectric layer to form complementary metal-oxide-semiconductor (CMOS) structures. FIG. 3 is a schematic cross-sectional view of the structure of FIG. 2B after replacing part of the dielectric layer with a differently doped dielectric layer. In some embodiments, part of the dielectric layer 120 may be removed, another dielectric layer is deposited to replace the removed part of the layer 120, and the other dielectric layer is doped to form a dielectric layer 130 oppositely doped from the layer 120. Removal of part of the layer 120 may be accomplished by patterning a mask over the layer 120, the mask protecting parts of the layer 120 to be retained, while exposing the parts of the layer 120 to be removed. An etch selective for the material forming the layer 120, for example, a fluorocarbon etch where the layer 120 is formed of silicon oxide, may then be performed to selectively remove the exposed parts of the layer 120. The dielectric layer 130 may subsequently be deposited into the areas in which the layer 120 was removed. The dielectric layer 130 is oppositely doped relative to the layer 120. As with the layer 120, the dielectric layer 130 may be doped as-deposited, or after deposition of that layer. Where the layer 120 includes a p-type dopant, the layer 130 may be doped with an n-type dopant, such as phosphorus. In some embodiments, the layers 120 and 130 may be formed of different materials. In some other embodiments, the layers 120 and 130 may be formed of the same material, which can provide advantages for later processing, such as etching processes, by allowing the same etch chemistries be used to etch both the layers 120 and 130. It will be appreciated that material forming the layer 130 may extend over the layer 120 after the layer 130 so formed. A chemical mechanical polishing (CMP) process may be performed to form a level surface for the formation of overlying structures.

Figure 4:
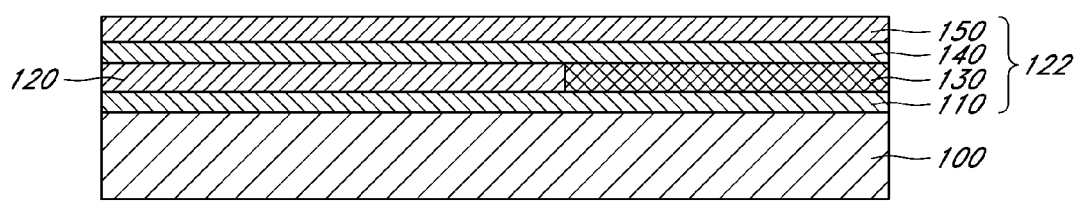
FIG. 4 is a schematic cross-sectional view of the structure of FIG. 3 after forming a spacer layer and an additional dielectric layer to form additional parts of the dielectric stack.

Formation of the dielectric stack 122 continues with the formation of additional layers of material. FIG. 4 is a schematic cross-sectional view of the structure of FIG. 3 after forming a spacer layer 140 and additional dielectric layer 150. The spacer layer 140 may be formed of a material that is different from the materials of the dielectric layers 120 and 130, and is resistant to etches for removing the dielectric layers 120 and 130. In some embodiments, the spacer layer 140 is formed of a dielectric material, and may be the same material as that forming the etch stop layer 110. For example, the spacer layer 140 may be formed of silicon nitride. In some embodiments, the dielectric layer 150 is formed of silicon oxide. It will be appreciated that one or both the layers 140 and 150 may be formed by, e.g., such as CVD or ALD. It will be also appreciated that various layers in the dielectric stack 122 are referred to as spacer layers and dielectric layers for ease of description. Both the spacer and the dielectric layers, however, may be formed of dielectric material.

As described further herein, the thickness of the dielectric layer 150 may determine the length of the channel in a transistor formed in the dielectric stack 122. In some embodiments, the thickness of the dielectric layer 150 is about 3-30 nm, about 3-15 nm, or about 3-10 nm. In some embodiment, the dielectric layer 250 is deposited by ALD, which can provide exceptional control over film thickness, and, thus, control the channel length defined by this thickness.

Figure 5:
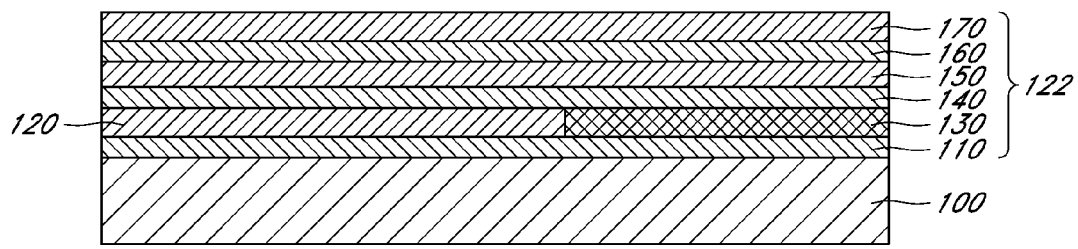
FIG. 5 is a schematic cross-sectional view of the structure of FIG. 4 after forming an additional spacer layer and an additional dielectric layer to form additional parts of the dielectric stack.

Additional layers may subsequently be added to the dielectric stack 122. FIG. 5 is a schematic cross-sectional view of the structure of FIG. 4 after forming an additional spacer layer 160 and an additional dielectric layer 170 to form additional parts of the dielectric stack 122. The spacer layer 160 and dielectric layer 170 may be similar to and formed as described herein for the layers 140 and 150, respectively. In some embodiments, the spacer layers 160 and 140 are formed of the same material and/or the dielectric layers 150 and 170 may be formed of the same material.

In some embodiments, the dielectric layer 170 may be doped. For example, the dielectric layer 170 may be doped similarly as the dielectric layer 120 and may include, for example, a p-type dopant such boron. As with the layer 120, the doping may be accomplished by various processes, such as ion implantation, diffusion of gaseous dopant species, and/or by incorporation of dopant as the dielectric layer 170 is deposited.

Figure 6:
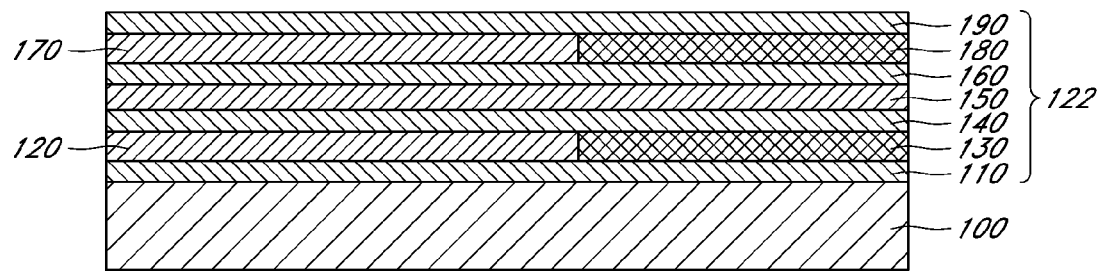
FIG. 6 is a schematic cross-sectional view of the structure of FIG. 5 after replacing part of the dielectric layer with a differently doped dielectric and depositing an additional spacer layer.

The dielectric stack 122 may subsequently be augmented with additional layers. FIG. 6 is a schematic cross-sectional view of the structure of FIG. 5 after replacing part of the dielectric layer with a differently doped dielectric layer 180 and subsequently depositing an additional spacer layer 190. The doped dielectric layer 180 may be formed in a similar fashion as the doped dielectric layer 130. For example, a portion of the layer 170 may be removed and then replaced with the doped dielectric layer 180, which may be doped as-deposited or doped after deposition of an un-doped layer 180. The layers 170 and 180 may also be subjected to a CMP process to form a smooth level surface for later-processing. In some embodiments where the dielectric layer 170 is p-doped, the dielectric layer 180 may be doped with an n-type dopant.

With continued reference to FIG. 6, an additional spacer layer 190 may be formed over the doped dielectric layers 170 and 180. In some embodiments, the spacer layer 190 is formed of a material resistant to etch chemistries that may later be used to etch the layers 170 and 180. For example, the spacer layer 190 may be formed of the same material used to form the spacers layers 160 and 140 and/or the etch stop layer 110. In some embodiments where the dielectric layers 170 and 180 are formed of silicon oxide, the spacer layer 190 may be formed of silicon nitride.

Thus, with continued reference to FIG. 6, the dielectric stack 122 may be formed with a plurality of dielectric layers 120, 130, 150, 170, and 180; and with a plurality of spacer layers 140, 160, and 190 separating those dielectric layers. As noted herein, in some embodiments, the spacer layers 140, 160, and 190 may be formed of material that is resistant to etches that will later be used to remove parts of the dielectric layers 120, 130, 150, 170, and 180. Thus, the spacer layers 140, 160, and 190 and the etch stop layer 110 may function as etch stops. The material forming the spacer layers 140, 160, and 190 and the etch stop layer 110 may also be formed of a dielectric material and may function to provide electrical insulation between later-formed conductive components. In some embodiments, as illustrated, the layers 120 and 130, and 170 and 180, may be disposed on the same vertical level and may be oppositely doped.

Figure 7A:
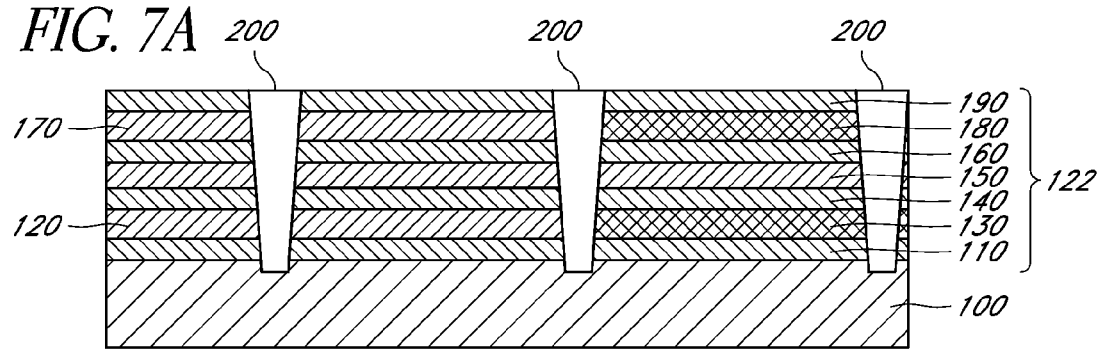
FIG. 7A is a schematic cross-sectional view of the structure of FIG. 6 after forming lateral etch stops.

Next, in a second phase of some embodiments, lateral etch stops are formed to divide the dielectric stack 122 into discrete areas, to facilitate the fabrication of electronic devices in those discrete areas. FIG. 7A is a schematic cross-sectional view of the structure of FIG. 6 after forming lateral etch stops 200. The lateral etch stops 200 may be formed by depositing and patterning a protective mask (not shown) over the dielectric stack 122, with the protective mask exposing portions of the top surface of the dielectric stack 122. Trenches may be etched into those portions by a directional etch (e.g., an anisotropic etch). The trenches may be subsequently filled with material resistant to etches that may later be used to remove parts of the dielectric layers 120, 130, 170, and 180. In some embodiments, the etch stops 200 may be formed of the same material as other etch stop layers, including the layers 110, 140, 160, or 190. For example, the etch stops 200 may be formed of silicon nitride.

While the etch stops 200 are illustrated with no hatching for ease of illustration, it will be appreciated that etch stops 200 may contain a single homogeneous material, or may include two or more different materials. For example, the etch stops 200 may include one or more layers of material, including a liner that functions as an etch stop layer and another material that fills out the remainder of the volume of the etch stops 200. Advantageously, the liner may be selected to have desired etch stop properties and the filler may be selected to facilitate complete filling out of the volume of the etch stop and/or provide high deposition rates. In some embodiments, the liner may be formed of silicon nitride and the filler may be formed of silicon oxide. The liner may be deposited by CVD or ALD. Advantageously, ALD can provide exceptionally high conformality and uniformity. The filler may also be deposited by CVD or ALD. Advantageously, CVD may provide high deposition rates, for increasing process throughput. After the lateral etch stop 200 is filled, any excess material extending over the dielectric stack 122 may be removed by, e.g., a CMP process.

Figure 7B:
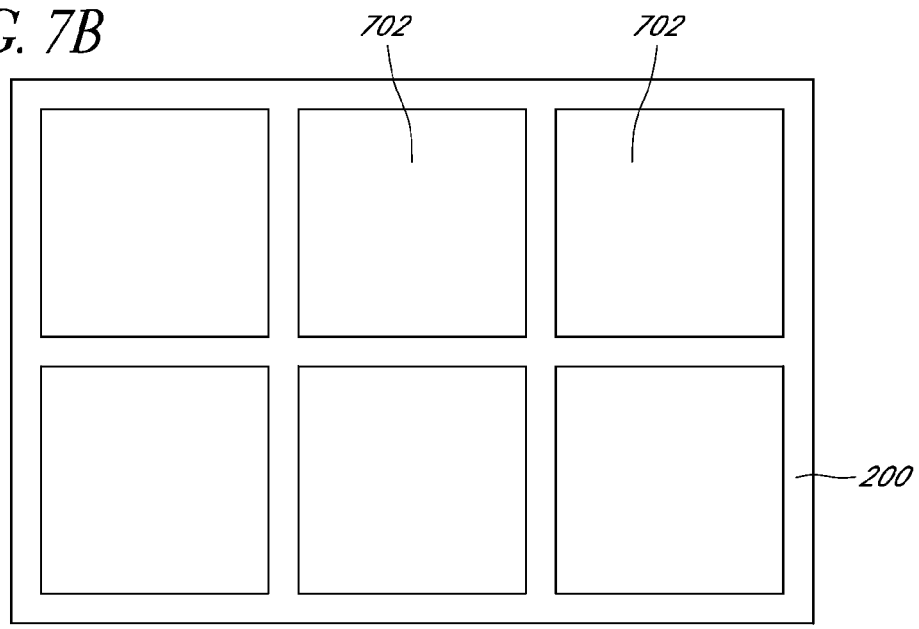
FIG. 7B is a schematic top-down view of the structure of FIG. 7A.

It will be appreciated that the lateral etch stops 200 may constitute sidewalls delineating individual cells, each of which will contain an electronic device. FIG. 7B is a schematic top-down view of the structure of FIG. 7A. As illustrated, the lateral etch stops 200 of FIG. 7A may form a continuous boundary around each of the cells 702. The shapes may be selected to provide close packing of the cells 702. In some embodiments, as illustrated, lateral etch stops may define a rectangular or square shape for the cells 702. In some other embodiments the cells may have a hexagonal shape. It will be appreciated that other arbitrary shapes may also be defined as desired.

In a third phase of some embodiments, a wire is formed in the dielectric stack 122. FIG. 8 is a schematic cross-sectional view of the structure of FIGS. 7A and 7B after etching openings 210 for accommodating wires in the dielectric stack 122. The openings 210 may be formed by depositing and patterning a mask (not shown) over the dielectric stack 122, with the mask exposing some areas of the dielectric stack 122. The exposed areas of the dielectric stack 122 are etched using a directional etch to define the openings 210, which may extend into the substrate 100.

The openings 210 are then filled to form wires 220. FIG. 9 is a schematic cross-sectional view of the structure of FIG. 8 after filling the openings 210 in the dielectric stack 122. In some embodiments, the openings are filled with a semiconductor material, such as silicon (Si), germanium (Ge), III-V materials (i.e., materials containing elements from Groups III and V of the periodic table), and/or combinations thereof. The semiconductor material may be deposited into the openings 210 by epitaxial deposition, including selective epitaxial deposition in which material is preferentially deposited into the opening 210. Advantageously, the small width and relatively large depth of the openings 210, and dielectric forming the sidewalls of the openings 210, can facilitate good quality epitaxial structures by taking advantage of the phenomenon of aspect ratio trapping. In some embodiments, the wires 220 may be so-called nanowires, having widths on order of the tens of nanometers or less. For example, the wires 220 may have a length (or height) of about 30-300 nm, or about 50-200 nm, and a width of about 3-20 nm, or 3-15 nm, or 3-10 nm.

With continued reference to FIG. 9, each of the openings 210 (FIG. 8) may be filled with the same material, thereby forming wires 220 of the same material. In some other embodiments, different wires 220 may include different materials. For example, some of the openings 210, such as those passing through layers 130 and 180 having a first dopant type, may be filled with a temporary, sacrificial material, while other openings 210, such as those passing through layers 120 and 170 of a second dopant type, are filled with a first semiconductor material. Subsequently, the sacrificial material is removed and the now-exposed openings 210 are filled with a second semiconductor material. Advantageously, the ability to fill different openings 210 with different material can allow selection of materials that may have better compatibility with the context in which the material is to be used. For example, some of the wires 220 may be formed of silicon, while others are formed of germanium or III-V materials. In some embodiments, Ge can be used to for the wire of a P-MOS structure and $In_xGa_{1-x}As$ (0<x<1) can be used to form the wire of an N-MOS structure.

In some other embodiments, individual wires 220 may be formed of a combination of different materials, with different materials disposed at different levels within the wires 220. For example, silicon may form one or two of the upper, middle, or lower portions of the wires 220, while germanium or III-V materials may form one or more of the other portions of the wires 220. In such embodiments, the various materials may be sequentially deposited into the openings 210. In some embodiments, the different materials may cause strain in the wire, thereby increasing charge carrier mobility. Because the wires 220 may be disposed in different contexts (e.g., they may later be differently doped), different wires 220 may include different sequences of materials selected for compatibility with the context in which they will be used.

The wire 220 may subsequently be doped. FIG. 10 is a schematic cross-sectional view of the structure of FIG. 9 after doping the wires 220 in the dielectric stack 122. In some embodiments, the wires 220 may be doped by a drive-in anneal in which the dielectric stack 122 is annealed, causing dopants in the dielectric layers 120, 170 and 130, 180, to be driven or diffused into the wire 220 that is in contact with those layers. As illustrated, after being doped, the wire 220 on the left side of the illustrated structure includes doped regions 220a and 220b. In some embodiments, the drive-in anneal is stopped before the dopant appreciably diffuses into a middle portion 220c of the left wire 220. Similarly, the right wire 220 includes doped portions 220a' and 220b' and a substantially undoped middle portion 220c'. In some embodiments, the substantially undoped middle portions 220c and 220c' may function as channel regions and may have a height of about 30 nm or less, about 20 nm or less, or about 5-15 nm.

In a fourth phase of some embodiments, contacts and conductive structures for interacting with the wires 220 are formed. FIG. 11 is a schematic cross-sectional view of the structure of FIG. 10 after forming openings 230 for defining lower contacts. The openings 230 may be formed by depositing and patterning a mask (not shown) over the dielectric stack 122. The dielectric stack 122 is etched with a directional etch through openings in the mask, thereby forming openings 230. It will be appreciated that the directional etch may utilize one or more etch chemistries and is configured to expose the layer 130 by stopping at or in that layer.

The walls of the openings 230 are subsequently lined with a liner. FIG. 12 is a schematic cross-sectional view of the structure of FIG. 11 after lining the openings 230 with liners 232. It will be appreciated that the openings 230 function to allow access to the dielectric layers 120 and 130, to thereby allow those layers to be exposed to etchant and removed. The liners 232 are deposited to protect the layers at the sides of the openings 230. In addition, the liners 232 may also function to provide lateral electrical insulation between later-formed conductive features and, as such, preferably are sufficiently thick to provide such insulation. In some embodiments, the liners 232 are formed by ALD, which allows a thin layer with high conformality, uniformity, and step coverage to be formed. In some embodiments, the material forming the liners 232 is the same material forming the layers 110 and 140. For example, the liner 232 may be formed of silicon nitride.

It will be appreciated that the liners 232 also line the bottoms of the openings 230 and block access to the layers 120 and 130. The part of the liners 232 at the bottoms of the openings 230 may be removed to provide access to the layers 120 and 130 for later etches. FIG. 13 is a schematic cross-sectional view of the structure of FIG. 12 after removing the liners 232 at the bottoms of the openings 230. This removal may be accomplished by subjecting the liners 232 to a directional etch, which preferentially removes parts of the liners 232 at the bottoms of the openings 230 relative to the parts of the liners 232 at the sides of the openings 230. Thus, the dielectric layers 120 and 130 may be exposed at the bottoms of the openings 230.

The exposed dielectric layers 120 and 130 may subsequently be selectively removed, for example, using a wet etch selective for the material forming these layers. FIG. 14 is a schematic cross-sectional view of the structure of FIG. 13 after removing exposed dielectric layers 120 and 130 to leave open volumes 240 extending under the surface of the dielectric stack 122. These open volumes 240 may also be referred to as buried open volumes. Lower portions 220a and 220a' of the wires 220 are exposed in the buried open volumes 240. It will be appreciated that the lateral etch stops 200 and the etch stop 110 and spacer layer 140 may confine etchants used to remove the dielectric layers 120 and 130. Thus, the buried open volumes 240 may be confined within each cell 702, and within a particular level of each cell. It will be appreciated that FIG. 14 and many of the following figures focus on two cells 702 for ease of illustration. However, the processes disclosed herein may be applied to each of an array of such cells 702. For example, it may be understood that if, at the left and/or right sides of the cells 702 shown in FIGS. 13 and 14, additional cells are present, additional openings 230 may be formed in those cells.

Contact may subsequently be made to the lower portions 220a and 220a'. FIG. 15 is a schematic cross-sectional view of the structure of FIG. 14 after filling buried open volumes 240 with conductive material to form lower contacts 250. As illustrated, the lower contacts 250 make contact with the lower portions 220a and 220a' of the wires 220 and also extend to the top surface of the structure, where electrical connections to other circuitry may be made. The lower contacts 250 may be formed of, without limitation, a noble metal, noble metal oxide or nitride, such as: Ru, $RuO_2$, $IrO_2$, W, Ir, Pt, $SrRuO_3$, Rh, Pd, Ag, Cu, Re, Os or Au or mixtures thereof or NbN, ZrN, HfN, $MoN_x$, $WN_x$, VN, or TaN or mixtures thereof. Preferably, the lower contacts are formed of transition metals such Ti, Ta, Nb, W, Ni or mixtures thereof, or transition metal nitrides such as TiN, TaN, NbN and WN or mixtures thereof. In some embodiments, the lower contacts 250 may be formed by ALD. It will be appreciated that ALD can deposit precursors in roughly a self-limited layer (e.g., a monolayer) per deposition cycle. Multiple deposition cycles may be performed to completely fill the volumes 240. Such monolayer-by-monolayer growth allows the material forming the lower contacts 250 to substantially completely fill the buried volume 240 without pinching off the deposition at the neck of the opening 240, as may occur in other deposition processes in which the deposition rate more closely related to the local precursor concentration.

In embodiments where transistors are fabricated, gates may subsequently be formed. FIG. 16 is a schematic cross-sectional view of the structure of FIG. 15 after forming openings 260 for defining gates. An etch mask (not shown) is formed over the dielectric stack 122 and the dielectric stack 122 is etched through the etch mask using a directional etch to form the openings 260. The directional etch stops on or in the dielectric layer 150, thereby leaving a part of that layer 150 exposed.

Figure 17:
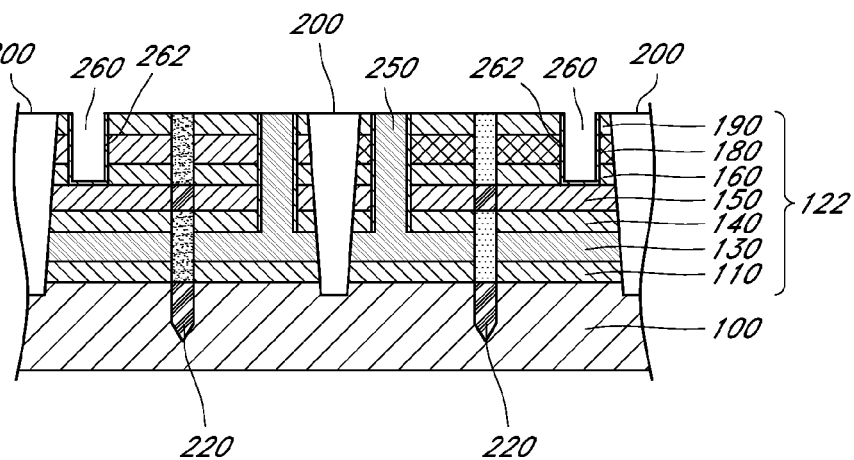
FIG. 17 is a schematic cross-sectional view of the structure of FIG. 16 after lining the openings with liners.

A liner is next deposited on the walls of the openings 260 to protect those walls from later etches used to remove parts of the layer 150. FIG. 17 is a schematic cross-sectional view of the structure of FIG. 16 after lining the openings 260 with liners 262. In some embodiments, the liners 262 are formed by ALD. The material forming the liners 262 may be the same material forming the layers 110 and 140 and the liners 232 (FIG. 12). For example, the liners 262 may be formed of silicon nitride.

Figure 18:
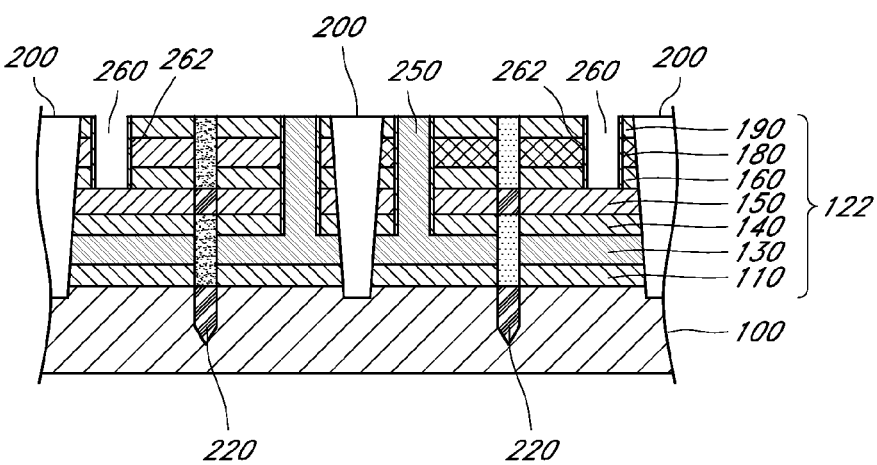
FIG. 18 is a schematic cross-sectional view of the structure of FIG. 17 after etching bottoms of the liners.

Because the bottom of the liners 262 may cover the bottoms of the openings 260, the bottoms of the liners 262 may be removed to allow etchants access to the underlying dielectric layer 150. FIG. 18 is a schematic cross-sectional view of the structure of FIG. 17 after etching a bottom of the liners 262. The etch may be a directional etch, which selectively removes the bottoms of the liners 262 while leaving the liners 262 on the sidewalls of the openings 260. Thus, the dielectric layer 150 are left exposed at the bottoms of the openings 260.

Figure 19:
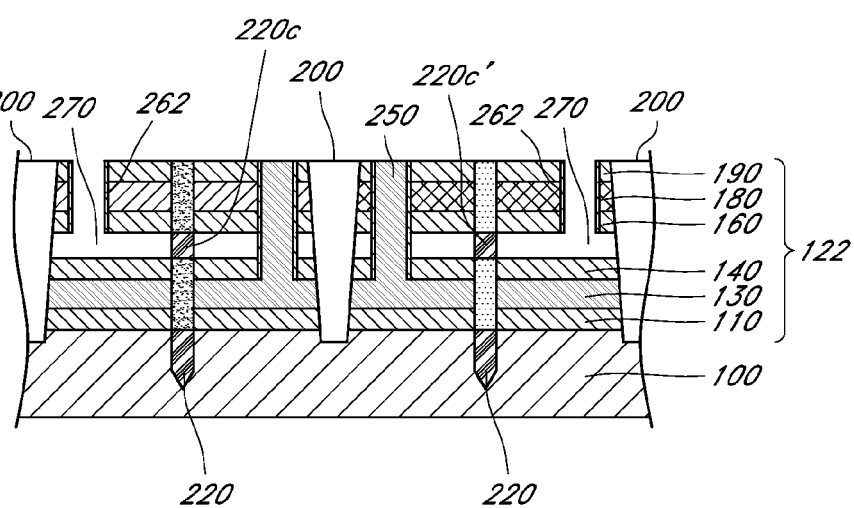
FIG. 19 is a schematic cross-sectional view of the structure of FIG. 18 showing buried open volumes formed after removing portions of a dielectric layer exposed by the openings.

The FIG. 19 is a schematic cross-sectional view of the structure of FIG. 18 showing buried open volumes 270 formed after removing portions of the dielectric layer 150 exposed by the openings 260. The dielectric layer 150 may be selectively removed with a wet etch selective for the material forming that layer. The resulting buried volumes 270 leave the middle portions 220c and 220c' of the wires 220 exposed.

It will be appreciated that the middle portions 220c and 220c' may function as channel regions and will be separated from a gate by a gate dielectric. Advantageously, this gate dielectric may be formed by simply lining the walls of buried volumes 270 with dielectric. FIG. 20 is a schematic cross-sectional view of the structure of FIG. 19 after forming dielectric liners 280 in the buried open volumes 270. In some embodiments, the dielectric liners 280 may be formed by ALD, which can provide reliable coverage on the sides of the middle portions 220c and 220c' while maintaining good thickness control.

The dielectric liners 280 are preferably formed of high-k dielectric materials (having a high dielectric constant than silicon oxide). Examples of high-k dielectric materials include hafnium (Hf) containing compounds, such as hafnium oxide. Other examples of high-k dielectric materials include oxides of zirconium (Zr), yttrium (Y), aluminum (Al), or titanium (Ti). In some embodiments, ALD deposition of the dielectric liners 280 includes alternating and sequential exposure of the buried open volumes 270 to metal and oxygen precursors, respectively. In some embodiments metal halides are used as the metal precursors, for example compounds having the formula $MX_n$, where M is a metal, X is a halogen, such as fluoride, chloride, bromide or iodide, preferably a chloride or iodide, and n is equal to the valence of M, for example $TiCl_4$, $TiBr_4$, and $TiI_4$ when M is Ti. In some embodiments, metal halide precursors comprise $AlCl_3$, $HfCl_4$, $HfI_4$, $SiCl_4$, $SiBr_4$, $SiI_4$, $SiF_4$, $ZrCl_4$ and $ZrI_4$. The metal precursor may be provided such that it forms no more than about a single molecular layer on the walls of the buried open volumes 270. The layer of the metal is then reacted with an oxygen precursor, including, without limitation: oxygen, plasma excited oxygen, atomic oxygen, ozone, water, oxygen/hydrogen, hydrogen/carbon dioxide, nitric oxide (NO), nitrogen dioxide ($NO_2$), nitrous oxide ($N_2O$), hydrogen peroxide ($H_2O_2$), etc. The alternating exposures to the metal and oxygen precursors can continue until a desired thickness for the dielectric liner 280 is reached.

In some embodiments, the dielectric material may include combinations of the material noted above, for example, hafnium oxide containing zirconium. In some embodiments, the high-k dielectric is a nanolaminate formed by constituent layers of two or more of these oxides (e.g., the nanolaminate may include layers of hafnium oxide and silicon oxide). For example, these oxides may be formed by ALD with alternating exposures to metal and oxygen precursors. The nanolaminates may be formed by changing the metal precursor used in different deposition cycles.

In some embodiments, the high-k dielectric can comprise $GeO_2$, $GeAlO_x$, $Al_2O_3$, $AlSiO_x$ and $TaSiO_x$ or any combination thereof.

A conductive material may subsequently be deposited into the open volumes 270 to form a gate. FIG. 21 is a schematic cross-sectional view of the structure of FIG. 20 after filling buried open volumes 270 with conductive material to form gates 290. Each gate 290 preferably extends completely around a perimeter of one of the wires 220. In some other embodiments, a gate 290 may extend partially around a wire 290. The conductive material extends to the top surface of the structure, to allow electrical contact to other circuitry. In some embodiments, the conductive material is a metal. Examples of metals include, without limitation, Ni, Fe, Co, Cu, Ag, Cr, V, Mn, Zn, Sn, Pb, Bi, In, and Cd. In some embodiments the conductive material is Ti, Ta, W, TiC, TaC, WC, TiN, TaN, WN, TiAlC or TaAlC or mixture thereof.

The conductive material may be deposited by various processes, including ALD, electrochemical deposition (e.g., electroplating), electroless plating, seedless plating, CVD, reactive deposition from supercritical fluids (e.g., chemical fluid deposition (CFD) using supercritical carbon dioxide $CO_2$ as a solvent), or combinations thereof. For example, in some embodiments, a seed layer may be deposited by ALD and the remainder of the layer may be deposited by electrochemical deposition.

In some embodiments, at least part of the gate 290 may be deposited by forming a metal oxide and then reducing the metal oxide to leave the metal layer. The metal oxide may be formed by, for example, CVD or ALD. In some embodiments, the metal oxide is formed by ALD, in which buried open volumes 270 are alternatingly exposed to metal and oxygen precursors, thereby forming a metal oxide. The oxide is then reduced to form the metal.

In some other embodiments, the metal gate may be formed using two different metal precursors during ALD to deposit a mixed oxide containing multiple metals. The mixed oxide is then reduced to form a mixed metal. For example, each complete mixed oxide ALD cycles may comprise a first deposition sub-cycle for forming up to a monolayer of a first material comprising a first metal and a second deposition sub-cycle for forming up to a monolayer of a second material comprising a second metal. The first and second deposition sub-cycles constitute a complete ALD cycles. The number of first deposition sub-cycles and second deposition sub-cycles in each complete ALD cycle may be varied to achieve the desired composition. In some embodiments, the mixed metal oxide that is formed will comprise more of the first metal than the second metal. In some embodiments at least 80%, at least 85%, at least 90%, at least 95%, at least 97%, at least 98%, at least 99% or at least 99.5% of the metal in the mixed metal oxide is the first metal. In some embodiments about 30-80%, or about 40-60% of the metal in the mixed metal oxide is the second metal. In some embodiments the first metal is selected from the group consisting of Ni, Fe, Co, Cu, Ag, Cr, V, Mn, Zn, Sn, Pb, Bi, In and Cd and the second metal is selected from the group consisting of Pt, Ni, Pd, Rh, Ru, and Co. Advantageously, the formation of a mixed oxide allows the oxide to be reduced at a lower temperature than an oxide that includes only one metal.

Following deposition, the metal oxide may be reduced. In some embodiments, the reduction can be conducted in a hydrogen atmosphere. In some embodiments the metal oxide is at least partially reduced in hydrogen-containing atmosphere, which can include $H_2$, $NH_3$, $N_2H_4$, hydrogen-containing plasma, hydrogen radicals, hydrogen atoms, or combination thereof. In some embodiments, the mixed metal oxide may be contacted with one or more reactive organic compounds, which contain at least one functional group selected from the group of alcohol (—OH), aldehyde (—CHO), and carboxylic acid (—COOH). In some embodiments, the substrate is reduced in a hydrogen environment and also contacted with an organic reducing agent.

In some embodiments, the metal oxide is reduced to form a metal layer, which is used as a seed layer for a subsequent electrochemical deposition of additional metal into the buried open volume 270.

In some other embodiments, CFD is performed to deposit a metal in the buried volume. It will be appreciated that a supercritical fluid (SCE) is a substance that is above its critical temperature and critical pressure. For example, $CO_2$ becomes a supercritical fluid when the temperature is above about +31° C. and the pressure is above about 73.75 bar. Mass transfer is rapid with supercritical fluids. Dynamic viscosities are about one order of magnitude smaller than in normal liquids and the surface tension of the supercritical fluid is negligible. Diffusion coefficients in supercritical fluids can be about one order of magnitude higher than in normal liquid. Advantageously, transport properties resemble those of gases while the density is near the density of liquids. SCFs penetrate into extremely narrow openings and dissolve a wide variety of compounds. Metals including copper can be dissolved into supercritical $CO_2$ (typical conditions are about +60° C., about 150 bar) with the aid of a chelating compound added to the solution. The supercritical fluid may then be removed, leaving behind the metal. Organometallic copper compounds can also be dissolved in supercritical $CO_2$. PCT publication WO 03/053895, A. Cabanas et al. in *J. Chemistry of Materials*, vol. 15(15) (2003), pp. 2910-2916. E. Kondoh et al. in *Microelectronic Engineering*, vol. 64(1-4) (2002) pp. 495-499 and J. M. Blackburn et al. in *Science*, vol. 294(5540) (2001) pp. 141-145, serve as examples of copper deposition from supercritical. $CO_2$.

It will be appreciated that the deposited conductive material can be a conductor other than a metal. In some embodiments, the conductive material can be a conductive polymer. Exemplary conductive polymers include, but are not limited to, iodine-doped polyacetylene, polyaniline, polypyrrole or polythiophenes. The polymer can be injection molded into trenches and vias in the case of thermosetting polymers. In other embodiments, monomers are polymerized and doped in situ to form electrically conducting polymers that fill the trenches and vias. For example, in one embodiment, the surfaces of openings are coated with a molecular layer of Ziegler-Natta catalyst, such as $Ti(OC_4H_9)_4/Al(C_2H_5)_3$, or any other compound that promotes the polymerization process. Exposure of the substrate to iodine or an iodine compound that releases iodine is performed either before the introduction of acetylene gas or at intervals during the introduction of acetylene gas into the reaction chamber. Then the openings are exposed to acetylene gas (as a monomer) and the openings become filled with polyacetylene that is doped with iodine. Liquid phase synthesis of polyacetylene has been described, e.g., by H. Shirakawa et al. in *J.C.S. Chem. Comm.* (1977), pp. 578-580, and B. Lesiak et al. in *Polish Chem.*, 74 (2000) pp. 847-865. The catalysts discussed in those publications are applied to the synthesis of doped conductive polymer from the gaseous monomers on the surfaces of vias and trenches.

In some other embodiments, the conductive material can be carbon nanotube wire. For example, relatively short carbon nanotube bits are suspended in a fluid, such as supercritical $CO_2$, and introduced to the buried volumes. Then the fluid is vaporized by lowering the pressure of the reaction chamber and the carbon nanotube bits adhere to each other through van der Waals interactions. Electrical current is then allowed to flow through the carbon nanotubes. Electrical conductivity of the carbon nanotube conductor improves during the current treatment possibly because of the formation of continuous carbon nanotube wires that can withstand extremely high current densities. "Welding" of carbon nanotubes to each other with electrical current has been suggested by K. Jiang et al. in *Nature*, 419 (2002) p. 801, which is incorporated by reference herein.

In other embodiments, the conductor 250 can be made of nanometal powder. A suitable nanometal powder is sold by Argonide Corporation, 291 Power Court, Sanford, Fla., USA, Preferably, in one embodiment, nanometal powder is suspended as a slurry in an inert fluid such as supercritical $CO_2$ and then introduced to the buried volumes. Fluid is removed from the structure by slowly decreasing the pressure of the reaction chamber. Then the substrate is heated to about 200-300° C. to start the sintering process. Nanometal particles fuse together and form a continuous conductor that extends through the buried volume, it is beneficial to select a nanometal powder mixture where the size distribution of the particles is fractal-like, for example, with three distinct size levels. The use of such a mixture enables very dense packing of metal particles into the buried volumes, because the smallest particles (e.g., about 1-3 nm in diameter) can fill the holes between the medium size particles (e.g., about 5-8 nm in diameter) and the medium size particles can fill the holes between the large size particles (e.g., about 10-20 nm in diameter). In this case the sintering process does not substantially decrease the volume of the conductor because there is little empty space between the particles before the sintering process.

In some embodiments, the conductive material can also be made of ultraconductors that contain polaron threads. L. Grigorov et al. teach in U.S. Pat. No. 5,777,292, the disclosure of which is incorporated herein by reference, the creation of a conductor that has polarons forming conducting threads through the material. More about polaron conductors has also been presented in a web page, http://www.ultraconductors.com. An electron with an accompanying local distortion in the material is called a polaron. Often the polaron is trapped by an impurity in the material. The polaron creates a potential well around itself. The electron in the polaron can move and serve as a carrier of electricity when the polarons are chained. Advantageously, the resistivity of the ultraconductors is between the resistivity of copper and superconductors, even above room temperature. In addition, extremely small RC delay is obtained and contact resistance is negligible.

Figure 22:
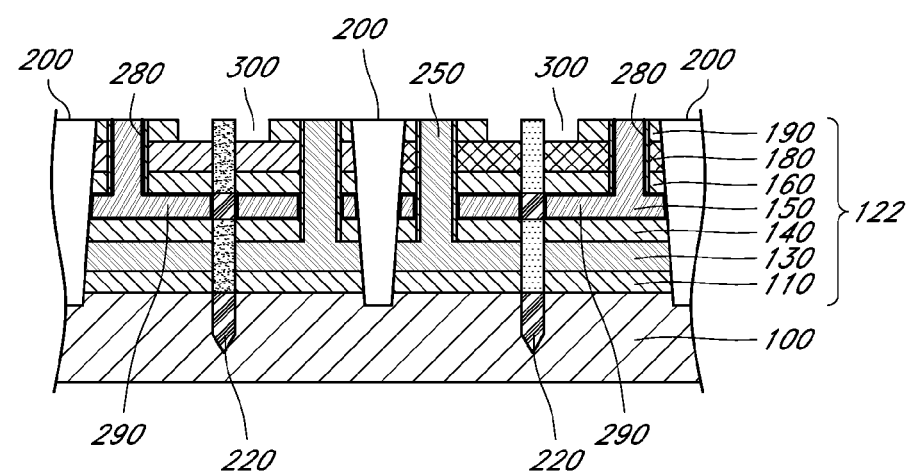
FIG. 22 is a schematic cross-sectional view of the structure of FIG. 21 after forming openings for defining upper contacts.

With reference now to FIG. 22, upper contacts for the wires 220 may subsequently be formed. FIG. 22 is a schematic cross-sectional view of the structure of FIG. 21 after forming openings 300 for defining the upper contacts. An etch mask (not shown) is formed over the dielectric stack 122 and spacer layer 190 is etched through the etch mask using a directional etch to form the openings 300. In some other embodiments where the spacer layer 190 is sufficiently thin, a wet etch may be used. The etch stops on or in the dielectric layers 170 and 180, thereby leaving those layers exposed.

Figure 23:
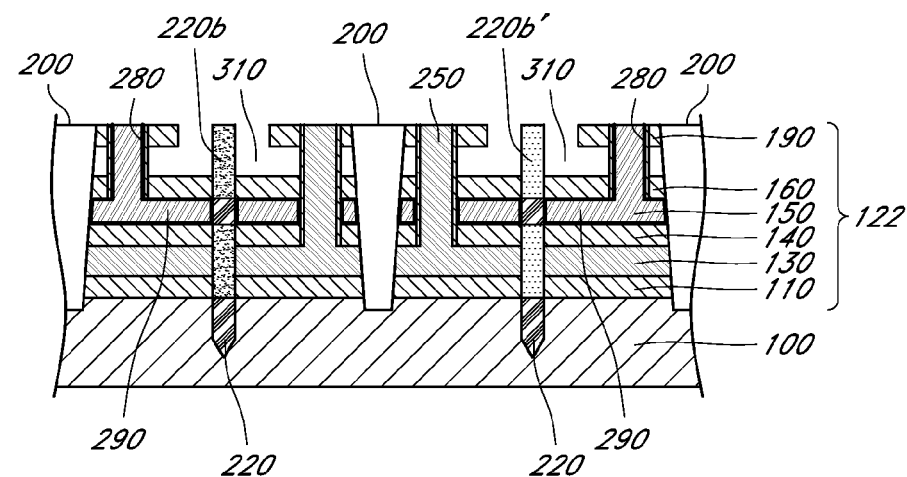
FIG. 23 is a schematic cross-sectional view of the structure of FIG. 22 after removing portions of dielectric layers exposed by the openings to form buried open volumes.

Portions of the dielectric layers 170 and 180 are subsequently removed. FIG. 23 is a schematic cross-sectional view of the structure of FIG. 22 after removing portions of dielectric layers 170 and 180 exposed by the openings 300. The dielectric layers 170 and 180 may be selectively removed with a wet etch selective for the material forming those layers. The resulting buried volumes 310 leave the upper portions 220b and 220b' of the wires 220 exposed. In some other embodiments, instead of a wet etch, a directional etch is used to etch the dielectric layers 170 and 180. In such a case, the open volume 310 is not a buried volume, but may simply be a trench having a width similar to the width of the opening 300 (FIG. 22) in the spacer layer 190.

Figure 24:
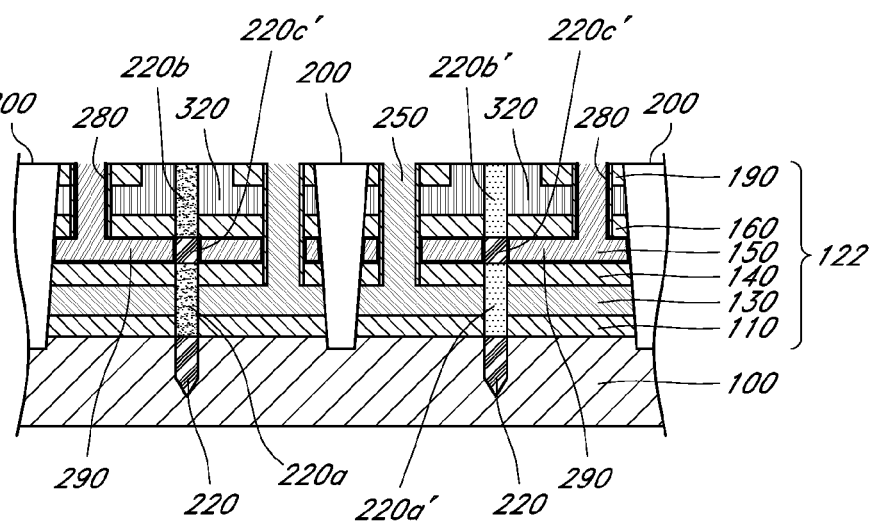
FIG. 24 is a schematic cross-sectional view of the structure of FIG. 23 after filling the buried open volumes with conductive material to form upper contacts.

The buried open volumes 310 may subsequently be filled with conductive material to form upper contacts to the upper portions 220b and 220b'. FIG. 24 is a schematic cross-sectional view of the structure of FIG. 23 after filling the buried open volumes 310 with conductive material to form upper contacts 320. In some embodiments, the conductive material may be, without limitation, a noble metal, noble metal oxide or nitride, such as: Ru, $RuO_2$, $IrO_2$, W, Ir, Pt, $SrRuO_3$, Rh, Pd, Ag, Cu, Re, Os or Au or mixtures thereof or NbN, ZrN, HfN, $MoN_x$, $WN_x$, VN, or TaN or mixtures thereof. In some embodiments, the upper contacts 250 may preferably be formed of metals such as Ti, Ta, Nb, W and Ni or metal nitrides such as TiN, TaN, NbN and WN, or mixtures thereof. In some embodiments, the upper contacts 320 may be formed by ALD. The upper contacts 320 make contact with the upper portions 220b and 220b' of the wires 220 and also extend to the top surface of the structure, where electrical connections to other circuitry may be made.

FIG. 25 is a schematic cross-sectional top-down view of the structure of FIG. 24. As illustrated, the lateral etch stops 200 separate a plurality of cells 702, each of which may include a semiconductor device, such as a transistor. FIG. 25 provides an example of a layout for the locations of the various contacts to the semiconductor device. Extensions of the upper contact 320, lower contact 250, and gate 290 may be seen on the top surface and spaced as desired to facilitate electrical contact to those structures. As illustrated, on this top surface, the upper contact 320 may have a circular shape, and the lower contact 250 and gate 290 may have rectangular shapes. It will be appreciated that these shapes may be arbitrary and other shapes may be utilized. Preferably, the cross-sectional shapes are selected to facilitate the flow of etchants for the various layers that are removed to form the upper contact 320, lower contact 250, and gate 290, and to facilitate making electrical contact to other circuitry. It will also be appreciated that the locations of these features on the top surface may also be arbitrary and other locations are possible. Preferably, the features are sufficiently spaced apart to reduce the likelihood of shorting and to facilitate alignment with other features, e.g., conductive plugs, (not shown) that connect these features to other electronic circuitry. Thus, it will be appreciated that FIGS. 24 and 25 provide partial cross-sectional side views of integrated circuits formed by the methods herein.

It will be appreciated that various modifications may be made to the methods disclosed herein. As noted herein, various deposition processes may be utilized to fill the buried volumes 240, 270, and/or 310. In some embodiments, all the volumes may be filled with the same material and may also use similar deposition processes. In some other embodiments, for reasons of, e.g., cost, materials properties and compatibility, and/or manufacturing ease, different materials may be utilized to fill different buried volumes. For example, the volume 270 may be filled with a metal to form the gate 290, while the volumes 240 and 310 may be formed with another conductive material to form lower and upper contacts 250 and 320. For example, the other conductive compound may be TiN deposited by ALD using metal halide precursors such as $TiCl_4$ and a nitrogen precursor such as $NH_3$. Exemplary ALD reactants for the deposition of metal conductors such as tungsten metal include metal compounds such as $WF_6$ and reducing agents such as boranes diborane $B_2H_6$). In some embodiments, the contacts 250 and 320 may be formed of any of the metals, and related deposition processes, noted herein for the gate 290. For example, nickel may be used to form the contacts 250 and 320 deposited by ALD.

In addition, in some embodiments, rather than replacing a part of the layer 120 to form the oppositely-doped layer 130, or replacing part of the layer 170 to form the oppositely-doped layer 180, different parts of the layers 120 and 170 may be doped with different dopants to form the differently doped layers 120 and 130. For example, a protective mask may be formed and patterned over the layer 120, with openings in the mask exposing parts that are to be doped with one type of dopant. Those exposed areas may then be doped and the mask may subsequently be removed and another mask may be formed and patterned, exposing other parts of the layer 120 that are to be doped with another dopant type. Those other exposed parts may then be doped using the other type of dopant. The mask may then be removed. The layer 170 may similarly be doped with different dopants. In some other embodiments, the differently doped layers 130 and 180 may be omitted to form a repeating array of similarly-doped wired-based devices.

In some embodiments, the layers 120 and/or 170 may not be doped and a drive-in anneal is not utilized to dope the wires 220. Rather, the wires 220 may be doped as-deposited. Such as-deposited doping may help to form sharp boundaries between the doped and undoped regions of the wires 220, which can increase the predictability of the electrical functionality of transistors formed using the wires.

In some embodiments, the wires 220 may form a tunnel field-effect transistor (TFET). With reference again to FIG. 10, rather than doping the lower and upper portions 220a, 220a' and 220b, 220b' with the same type of dopant, the lower and upper portions may be doped with different dopant types. For example, the lower portions 220a, 220a' may be doped with a p-type dopant, while the upper portions 220b, 220b' may be doped with an n-type dopant. Such doping may be accomplished by correspondingly doping the dielectric layers 120, 130 with one dopant type and doping the dielectric layers 170, 180 with another dopant type. A drive in anneal may then be performed to drive dopants into the wire 220, as discussed herein. In some other embodiments, the wire 220 is doped with the desired dopants as-deposited.

With continued reference to FIG. 10, in some embodiments, complementary TFETs may be formed by TFETs with differently doped wire portions at a particular level. The lower portions 220a and 220a' may be differently doped, the upper portions 220b and 220b' may be differently doped, and the upper and lower portions for an individual wire 220 may be differently doped. For example, the lower portions 220a and 220a' may be doped with n and p-type dopants, respectively, while the upper portions 220b and 220b' may be doped with p and n-type dopants, respectively. Doping may be accomplished with a drive-in anneal and/or as-deposited, as discussed herein.

In some embodiments, the wire 220 forming an individual TFETs may include two or more different semiconductor materials. For example, the lower portions 220a, 220b' and middle portions 220c may be formed of silicon, while the upper portions 220c, 220c' may be formed of germanium. In some embodiments, the silicon portions may be n-doped or undoped and the geranium portions may be p-doped, which can provide advantages for increasing current flow through the device. In some other embodiments, different TFET's may include different combinations of semiconductors for the wire 220. For example, in some embodiments with complementary TFETs, one of the wires 220 may include a p-doped germanium portion with n-doped and undoped silicon portions; and a complementary wire 220 may include an n-doped indium-arsenide portion with p-doped and undoped silicon portions.

It will be appreciated that source/drain contacts and gates for the TFETS may subsequently be formed as discussed herein for forming the contacts 230 and 320, and the gate 290.

It will be appreciated that the gates 290 and contacts 250 and 320 can be formed in other sequences. Advantageously, the etch stop layer 110 and spacer layers 140, 160, and 190 protect and isolate other features on other levels. For example, in some embodiments the gate 290 may be formed after the contacts 250 and 320.

Accordingly, it will be appreciated by those skilled in the art that various omissions, additions and modifications can be made to the processes and structures described above without departing from the scope of the invention. It is contemplated that various combinations or sub-combinations of the specific features and aspects of the embodiments may be made and still fall within the scope of the description. Various features and aspects of the disclosed embodiments can be combined with, or substituted for, one another in order. All such modifications and changes are intended to fall within the scope of the invention, as defined by the appended claims.

What is claimed is:

1. A method for manufacturing an electronic device, comprising:
   forming a transistor, wherein forming the transistor comprises:
      forming a stack of layers over a semiconductor substrate, the stack comprising:
         a first dielectric layer;
         a first spacer layer over the first dielectric layer;
         a second dielectric layer of the first spacer layer;
         a second spacer layer over the second dielectric layer; and
         a third dielectric layer over the second spacer layer;
      etching a vertically-extending hole completely through the stack;
      filling the hole with a semiconductor;
      selectively removing at least a portion of the first dielectric layer to form a first buried volume extending directly below the first spacer layer;
      filling the first buried volume with a conductor;
      selectively removing at least a portion of the second dielectric layer to form a second buried volume extending directly below the second spacer layer; and
      filling the second buried volume with a conductor.

2. The method of claim 1, further comprising:
   selectively removing at least a portion of the third dielectric layer to form a third buried volume; and
   filling the third buried volume with a conductor.

3. The method of claim 2, further comprising:
   lining the second buried volume with a dielectric layer before filling the second volume with the conductor.

4. The method of claim 3, wherein selectively removing the first dielectric layer exposes the semiconductor in the hole, and wherein the conductor filling the first buried volume contacts the semiconductor.

5. The method of claim 4, wherein selectively removing the third dielectric layer exposes the semiconductor in the hole, and wherein the conductor filling the third buried volume contacts the semiconductor.

6. The method of claim 2, wherein the conductor filling the first buried volume, the conductor filling the second buried volume, and the conductor filling the third buried volume each extend upwards to define parts of a same planar surface.

7. The method of claim 1, wherein the hole has a diameter of 15 nm or less.

8. The method of claim 1, further comprising doping the semiconductor in the hole after filling the hole with the semiconductor.

9. A method for manufacturing an electronic device, comprising:
   forming a transistor, wherein forming the transistor comprises:
      forming a channel region for the transistor, the channel region defined by a wire;
      forming a source/drain contact for the transistor, wherein forming the source/drain contact comprises:

forming a first buried volume;
lining the first buried volume with a first dielectric layer; and
filling the first buried volume with a first conductor;
forming a gate contact for the transistor, wherein forming the gate contact comprises:
forming a second buried volume separated from the first conductor by the first dielectric layer; and
filling the second buried volume with a second conductor; and
further comprising lining the second buried volume with a second dielectric layer before filling the second buried volume,
wherein the second dielectric layer has a higher dielectric constant than the first dielectric layer.

10. The method of claim 9, wherein lining the first buried volume with the first dielectric layer comprises lining a vertically-extending sidewall of the first buried volume with the dielectric.

11. A method for manufacturing an electronic device, comprising:
forming a transistor, wherein forming the transistor comprises:
forming a channel region for the transistor, the channel region defined by a wire;
forming a source/drain contact for the transistor, wherein forming the source/drain contact comprises:
forming a first buried volume;
lining the first buried volume with a first dielectric layer; and
filling the first buried volume with a first conductor;
forming a gate contact for the transistor, wherein forming the gate contact comprises:
forming a second buried volume separated from the first conductor by the first dielectric layer; and
filling the second buried volume with a second conductor; and
forming an other source/drain contact for the transistor, wherein forming the other source/drain contact comprises:
forming a third buried volume; and
filling the third buried volume with a third conductor.

12. The method of claim 11, wherein the first conductor, the second conductor, and the third conductor comprise a same metal.

13. The method of claim 12, wherein the first conductor, the second conductor, and the third conductor comprise a transition metal nitride.

* * * * *

UNITED STATES PATENT AND TRADEMARK OFFICE
CERTIFICATE OF CORRECTION

PATENT NO. : 9,553,148 B2  
APPLICATION NO. : 14/678301  
DATED : January 24, 2017  
INVENTOR(S) : Qi Xie Page 1 of 1

It is certified that error appears in the above-identified patent and that said Letters Patent is hereby corrected as shown below:

In Column 2 (page 2, item (56)) at Line 26, Under Other Publications, change "nantube" to --nanotube--.

In Column 14 at Line 11, Change "2910-2916." to --2910-2916,--.

In Column 14 at Line 15, Change "supercritical." to --supercritical--.

In Column 14 at Line 38, Change "Polish" to --Polish J.--.

In Column 14 at Line 60, Change "Polish" to --Polish J.--.

In Column 14 at Line 67, Change "volume, it" to --volume. It--.

In Column 16 at Line 48, After "boranes" insert --(e.g.,--.

In Column 18 at Line 19, Change "layer of the first spacer layer" to --layer over the first spacer layer--.

Signed and Sealed this  
Thirteenth Day of June, 2017

Joseph Matal  
*Performing the Functions and Duties of the*  
*Under Secretary of Commerce for Intellectual Property and*  
*Director of the United States Patent and Trademark Office*